United States Patent [19]
Kameda et al.

[11] Patent Number: 5,751,035
[45] Date of Patent: May 12, 1998

[54] SEMICONDUCTOR DEVICE PROVIDED WITH LDD TRANSISTORS

[75] Inventors: Yasushi Kameda, Yokosuka; Makoto Segawa, Yokohama, both of Japan

[73] Assignee: Kabushiki Kaisha Toshiba, Tokyo, Japan

[21] Appl. No.: 718,657

[22] Filed: Sep. 23, 1996

[30] Foreign Application Priority Data

Sep. 27, 1995 [JP] Japan .................................. 7-249164

[51] Int. Cl.⁶ .......................... H01L 27/108; H01L 29/76; H01L 29/94; H01L 31/119
[52] U.S. Cl. ............................. 257/300; 257/296
[58] Field of Search ............................. 257/296, 300

[56] References Cited

FOREIGN PATENT DOCUMENTS 6151773  5/1994  Japan .

*Primary Examiner*—Stephen Meier
*Attorney, Agent, or Firm*—Loeb & Loeb LLP

[57] ABSTRACT

A semiconductor device is provided with at least one transistor formed on a semiconductor substrate, the transistor being provided with a conductive sidewall spacer, and at least one conductive film formed so as to face a gate of the transistor via an insulative film, the conductive film covering at least an entire region of a gate region of the transistor and acting as a capacitor electrode. The conductive sidewall spacer and the conductive film are connected together. A potential is supplied to the conductive sidewall spacer and the conductive film, the potential being different from a potential of the gate of the transistor.

7 Claims, 5 Drawing Sheets

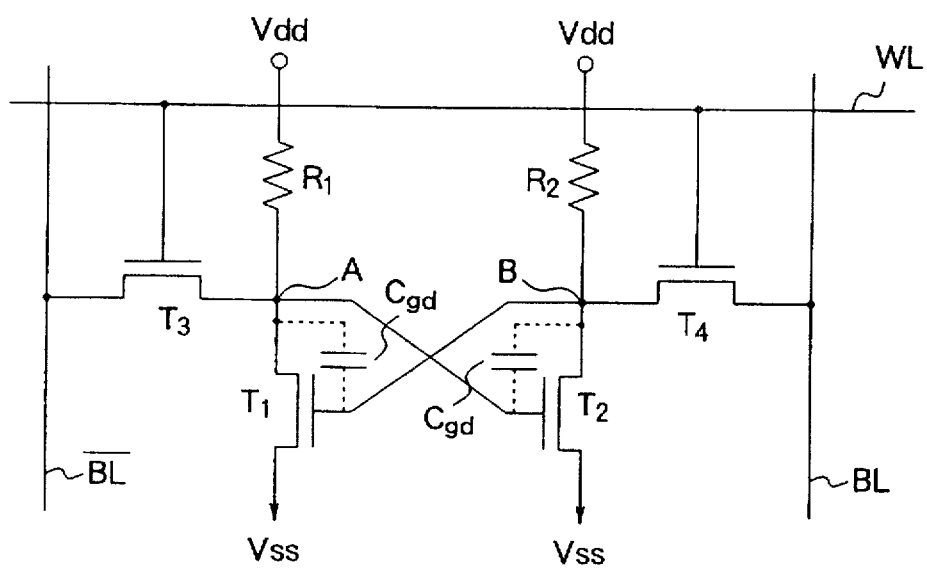
F I G. 1

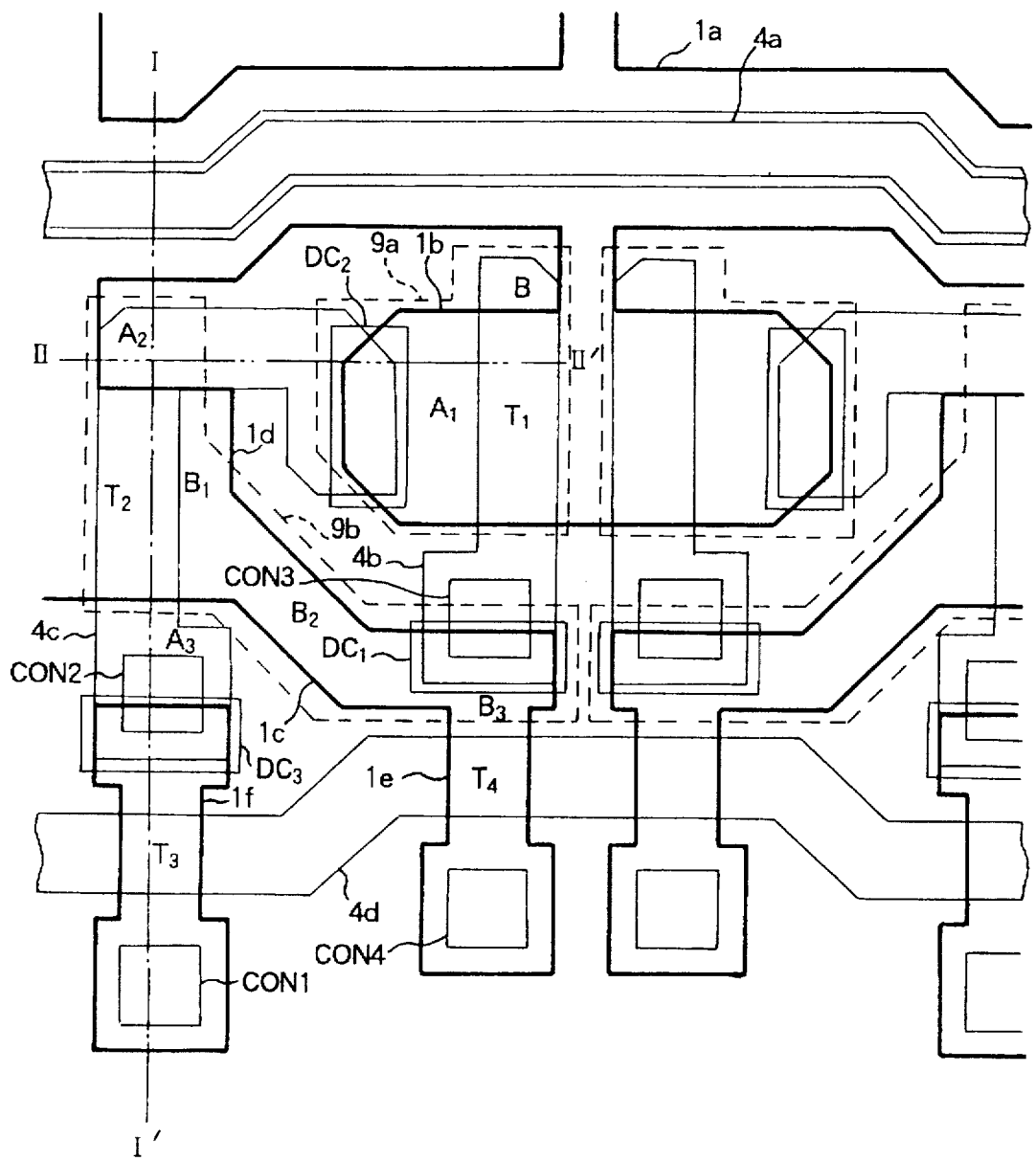
F I G. 2

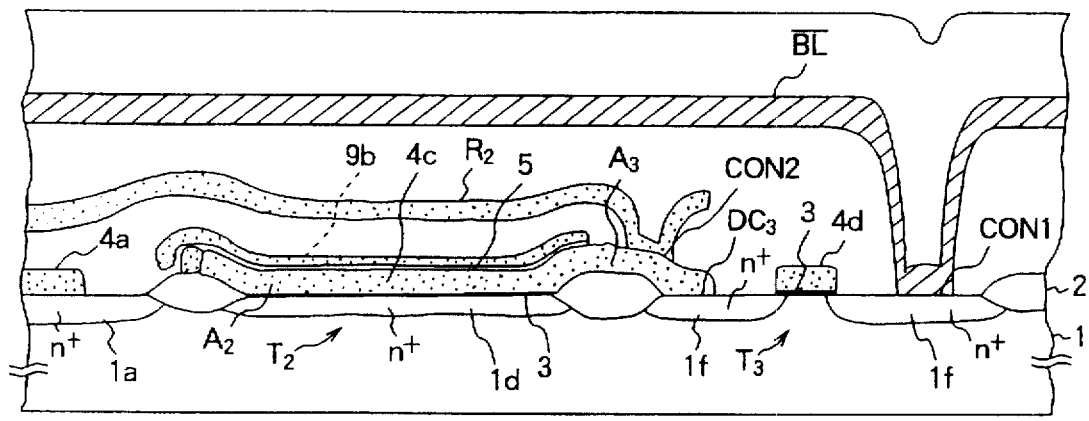
F I G. 3
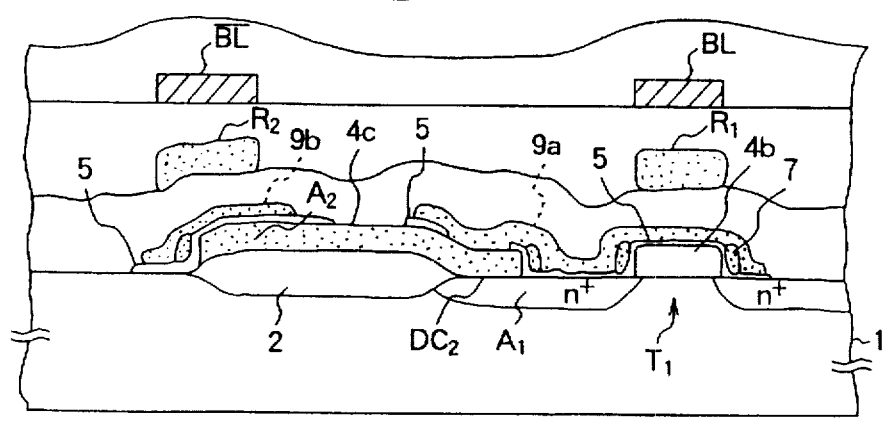
F I G. 4

SEMICONDUCTOR DEVICE PROVIDED WITH LDD TRANSISTORS

BACKGROUND OF THE INVENTION

The present invention relates to a transistor of a lightly-doped drain (LDD) structure and an integrated semiconductor device provided with LDD transistors.

A static random access memory (SRAM) has been known as one of integrated semiconductor devices. Data are stored in transistors formed in this memory. The higher integration of SRAM, the more SRAM cell patterns miniaturized with decrease in cell pattern area. When a SRAM cell pattern area is large, capacitance of data storage nodes becomes large so that data inversion rarely occurs. On the contrary, when the SRAM cell pattern area becomes small with higher integration of SRAM, the capacitance of data storage nodes also becomes small. This results in discharge of signal charges by α-rays, or soft error.

Several improvements have been made to avoid such soft error of SRAM cells. One is to put resistors into cross sections of each flip-flop of the SRAM cells. Another is to increase the capacitance of cell transistors.

Japanese laid-Open patent No. 6(1994)-151773 discloses a static semiconductor device. This device is provided with two types of MOS transistors of LDD structures. One is a cell drive transistor with a sidewall around a polysilicon gate electrode. Transistors of this type constitute a flip-flop. The other is a transistor for a peripheral circuit to cells. Gate-overlap capacitance of the gate electrode of the cell drive transistor is made large without increasing gate capacitance of the transistor for the peripheral circuit to restrict lowering of access time and avoid soft error.

However, in this device, an additional capacitance to the MOS transistor is obtained by adjusting the sidewall around the polysilicon gate electrode. And hence, the additional capacitance cannot be freely controlled.

Further, it is preferable to adjust signal delay among integrated circuits of the SRAM using operational characteristics of MOS transistors. However, the above conventional device cannot serve to do such adjustment due to the fact that the additional capacitance cannot be freely controlled.

SUMMARY OF THE INVENTION

An object of the present invention is to provide a transistor of a LDD structure, a semiconductor device including the LDD transistor, and a production method thereof in which an additional capacitance to the LDD transistor can be freely controlled.

The present invention provides a semiconductor device comprising: at least one transistor formed on a semiconductor substrate, the transistor being provided with a conductive sidewall spacer; at least one conductive film formed so as to face a gate of the transistor via an insulative film, the conductive film covering at least an entire region of a gate region of the transistor and acting as a capacitor electrode; and means for connecting the conductive sidewall spacer and the conductive film and supplying a potential to the conductive sidewall spacer and the conductive film, the potential being different from a potential of the gate of the transistor.

Further, the present invention provides a static random access memory cell circuit device comprising: at least one flip-flop having two transistors, each transistor formed on a semiconductor substrate, each transistor being provided with a conductive sidewall spacer; a conductive film formed so as to face a gate of each transistor via an insulative film, the conductive film covering at least an entire region of a gate region of each transistor and acting as a capacitor electrode; and means for connecting the conductive sidewall spacer and the conductive film and supplying a potential to the conductive sidewall spacer and the conductive film, the potential being different from a potential of the gate of each transistor. Further, the present invention provides a method of producing a semiconductor device, comprising the steps of: producing a circuit including a plurality of MOS transistors on a semiconductor substrate; forming an insulative film on the semiconductor substrate to cover the circuit; depositing a first conductive material on the insulative film; forming a sidewall spacer on a gate of each MOS transistor by etching the first conductive material; exposing a part of the circuit by opening a part of the insulative film after the first conductive material is etched; depositing a second conductive material over the semiconductor substrate so that the second conductive material is deposited on the exposed part of the circuit; and patterning the second conductive material so that one part of the second conductive material covering at least the gate of one of the MOS transistors and the sidewall spacer formed on the gate of the one MOS transistor is connected to the circuit, while the other part of the second conductive material covering the other MOS transistors and the sidewall spacers formed on the gates of the other MOS transistors are removed.

Further, the present invention provides a method of producing a semiconductor device, comprising the steps of: producing a circuit including a plurality of MOS transistors on a semiconductor substrate; forming an insulative film on the semiconductor substrate to cover the circuit; depositing a first conductive material on the insulative film; forming a sidewall spacer on a gate of each MOS transistor by etching the first conductive material; leaving at least the sidewall spacer of one of the MOS transistors while removing the sidewall spacers of the other MOS transistors and exposing a part of the circuit by opening a part of the insulative film; depositing a second conductive material over the semiconductor substrate so that the second conductive material is deposited on the exposed part of the circuit; and patterning the second conductive material so that one part of the second conductive material covering at least the gate of the one MOS transistor and the sidewall spacer formed on the gate of the one MOS transistor is connected to the circuit, while the other part of the second conductive material covering the other MOS transistors are removed.

BRIEF DESCRIPTION OF THE DRAWINGS

FIG. 1 shows a circuit diagram of a SRAM cell circuit;

FIG. 2 shows a circuit pattern of the SRAM cell circuit shown in FIG. 1 according to the present invention;

FIG. 3 shows a cross-section of the SRAM cell circuit in the I—I' direction as shown in FIG. 2;

FIG. 4 shows a cross-section of the SRAM cell circuit in the II—II' direction as shown in FIG. 2;

DETAILED DESCRIPTION OF THE PREFERRED EMBODIMENTS

Figure 5A:
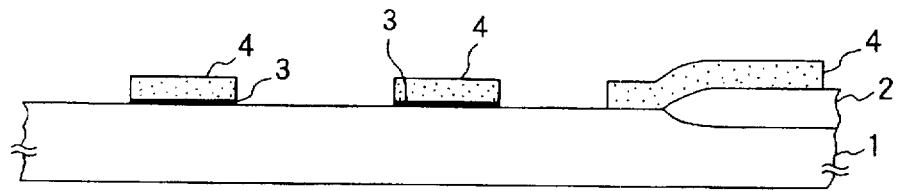
FIGS. 5A–5C, 6A–6C, and 7A–7B explain a method of producing a semiconductor device according to the present invention.

Preferred embodiments according to the present invention will be described with reference to the attached drawings.

The following embodiments employ a SRAM. Because the present invention is particularly effective when applied to the SRAM.

Firstly, a description of SRAM capacity is given. FIG. 1 shows a SRAM cell circuit. This circuit is provided with NMOS drive transistors T1 and T2. The gate of the transistor T1 is connected to the drain of the transistor T2. And, the gate of the transistor T2 is connected to the drain of the transistor T1.

The SRAM cell circuit is further provided with resistors R1 and R2 connected to the drains of the transistors T1 and T2, respectively. The SRAM cell circuit is supplied with a supply voltage Vdd via resistors R1 and R2 and another supply voltage Vss via sources of the transistors T1 and T2.

The SRAM cell circuit is further provided with transfer transistors T3 and T4. The transistor T3 is connected at its gate to a word line WL to switch connection between the transistor T1 and a bit line /BL. The transistor T4 is connected at its gate to the word line WL to switch connection between the transistor T2 and a bit line BL.

As shown in FIG. 1, the drive transistors T1 and T2 constitute a flip-flop. In operation, complementary data signals are supplied to the bit lines BL and /BL and the word line WL is activated to turn on the transfer transistors T3 and T4. The data signals are transferred via transistors T3 and T4 and held by the flip-flop. The word line WL is activated again to turn on the transfer transistors T3 and T4. The complementary data signals are output from the flip-flop to the bit lines BL and /BL via transistors T3 and T4.

The storage nodes for holding charges (data) in the memory cell are points A and B as shown in FIG. 1. The cell capacitance of the node A is mainly composed of the gate capacitance of the drive transistor T2, the diffused capacitance of the drive transistor T1, the diffused capacitance of the transfer transistor T3, and the wire capacitance among the transistors and resistors. Further, the cell capacitance of the node B is mainly composed of the gate capacitance of the drive transistor T1, the diffused capacitance of the drive transistor T2, the diffused capacitance of the transfer transistor T4, and the wire capacitance among the transistors and resistors.

However, the cell capacitance of the nodes A and B mostly depends on the gate capacitance of the drive transistor T2 and T1, respectively. Under consideration of this fact, the present invention provides a semiconductor device with a large gate capacitance of drive transistors.

FIG. 2 shows a main circuit pattern of the SRAM circuit (FIG. 1) of a multi-layered structure formed on a semiconductor substrate. In the figure, a pair of memory cells of the same structure are shown and hence only the left side memory is described below. Layers, such as, insulative layers are not shown.

In the upper section of FIG. 2, an ion implanting area 1a and a polysilicon layer 4a are directly joined together. A supply voltage Vss is supplied through the polysilicon layer 4a to the circuit. In the middle section of FIG. 2, an ion implanting area 1b is joined at its middle upper portion to the ion implanting area 1a. The ion injection area 1b covers the source, drain, and gate regions of the drive transistor T1. The gate of the drive transistor T1 is made up of a polysilicon layer 4b. This gate is connected to an ion implanting area 1c via direct contact DC1. The ion implanting area 1c is joined to ion implanting areas 1d and 1e. The areas 1d and 1e are used as the source, drain, and gate regions of the drive transistor T2 and transfer transistor T4, respectively.

An ion implanting area if works is used as the source, drain, and gate regions of the transfer transistor T3. A polysilicon layer 4c is used as the gate of the drive transistor T2. One end of the polysilicon layer 4c is connected to the drain of the transistor T1 via contact DC2, the other end to the drain of the transistor T3 via contact DC3.

The source of the transistor T3 is connected to the bit line /BL of an aluminum layer (not shown in FIG. 2) via contact CON1. The contact node of the polysilicon layer 4c that connects the gate of the transistor T2 and the drain of the transistor T3 is connected to a polysilicon layer not shown that constitutes the resistor R1 of high resistance. The contact node of the polysilicon layer 4b that connects the gate of the transistor T1 and the drain of the transistor T4 is connected to another polysilicon layer not shown that constitutes the resistor R2 of high resistance. The source of the transistor T4 is connected to the bit line BL of an aluminum layer (not shown in FIG. 2) via contact CON4. A polysilicon layer 4d is formed so that it bridges the ion implanting areas 1f and 1e that constitute the transistors T3 and T4, respectively. The polysilicon layer 4d constitutes the gates of the transistors T3 and T4 and works as the word line WL.

Areas A1 to A3 and B1 to B3 in FIG. 2 correspond to the nodes A and B in FIG. 1, respectively. More in detail, the node A corresponds to the drain of the drive transistor T1 (area A1), the contact DC2, the polysilicon layer 4c (area A2), the gate of the drive transistor T2, the contact CON2 that connects the polysilicon layer 4c (area A3) and the polysilicon layer (not shown in FIG. 2) for the resistor R2, the contact DC3, and the drain region 1f of the transistor T3.

The bold line shown in FIG. 2 depicts the contour of the source, drain, and gate regions 1a to 1f formed by ion implantation. Further, the broken line shown in FIG. 2 depicts the contour of polysilicon layers 9a and 9b that cover the source, drain, and gate regions of the drive transistors T1 and T2, respectively. These transistors are MOS transistors of LDD structures. Each LDD transistor is provided with a gate electrode with a conductive sidewall spacer.

The polysilicon layer 9a is connected to the drain of the transistor T1 via contact DC2 and also to the conductive sidewall spacer of the transistor T1. The sidewall spacer is made of silicon. The polysilicon layer 9b is connected to the drain of the transistor T2 via contact DC1 and also to the conductive sidewall spacer of the transistor T2.

The polysilicon layers 9a and 9b and sidewall spacers provide mirror capacitance Cgd of the transistors T1 and T2 shown in FIG. 1. Such capacitance depends on the areas of the polysilicon layers 9a and 9b over the source, drain, and gate regions of the transistors T1 and T2, respectively.

FIGS. 3 and 4 show the cross-sections of the drive transistor T2 and the transfer transistor T3 of the SRAM cell in the directions I—I' and II—II', respectively, as shown in FIG. 2.

In FIGS. 3 and 4, the polysilicon layer 9a is deposited on the polysilicon gate 4b of the drive transistor T1 via insulative layer 5, joined to the conductive sidewall portion of the gate of the transistor T1, and connected to the drain of the drive transistor T2. Further, the polysilicon layer 9b is deposited on the polysilicon gate 4c of the drive transistor T2 via insulative layer 5, joined to the conductive sidewall of the gate of the transistor T2, and connected to the drain of the transistor T1. As described above, the polysilicon layers 9a and 9b are so formed that they cover the source, drain, and gate regions of the transistors T1 and T2, respectively, to have large capacity of the storage nodes A and B that are parts of the flip-flop.

Next, a method of producing the semiconductor device according to the present invention will be described with reference to FIGS. 5A to 8B. These figures explain the method of simultaneously forming both an ordinary MOS transistor, such as the transfer transistor T3, and a MOS transistor with a capacitor connected between its gate and drain, such as the drive transistor T1 as shown in FIG. 1.

As shown in FIG. 5A, MOS transistors are formed on the surface of a silicon substrate 1 by a well known method. Channel-stop ions are implanted into the surface of the silicon substrate 1 with a nitride film as a mask. Further, a field oxide film 2 is formed on the surface of the silicon substrate 1. The mask is removed and a gate oxide film 3 is formed. A polysilicon layer 4 is deposited on the gate oxide film 3. The polysilicon layer 4 is patterned to form gates and wiring. Further, ions of low concentration are implanted into the opened source and drain regions.

Figure 5B:
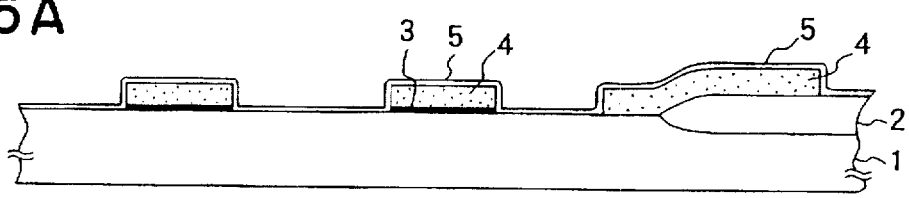
Figure 5C:
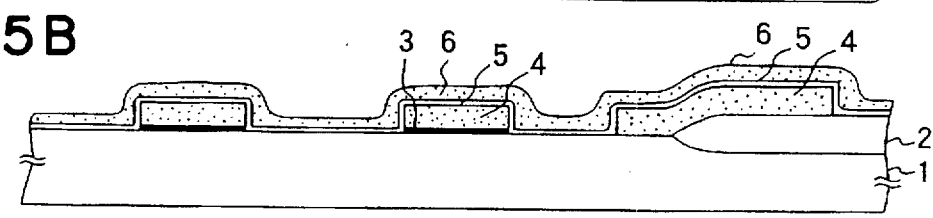
Figure 6A:
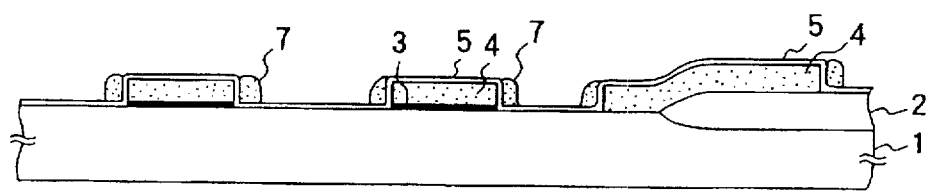

A thin insulative film is formed on the surface of the substrate 1 and then transformed into a silicon oxide film 5 by thermal oxidation as shown in FIG. 5B. This silicon oxide film 5 will become an insulative film of a capacitor to be obtained. A polysilicon layer 6 for a sidewall spacer is deposited on the silicon oxide film 5 as shown in FIG. 5C. The polysilicon layer 6 is removed by anisotropic etching, such as reactive ion etching, to form sidewall spacers 7. Thus, the sidewall spacers 7 are made of a conductive material not an insulative material. Ions of high concentration are implanted into the substrate 1 to have a LDD structure as shown in FIG. 6A.

Figure 6B:
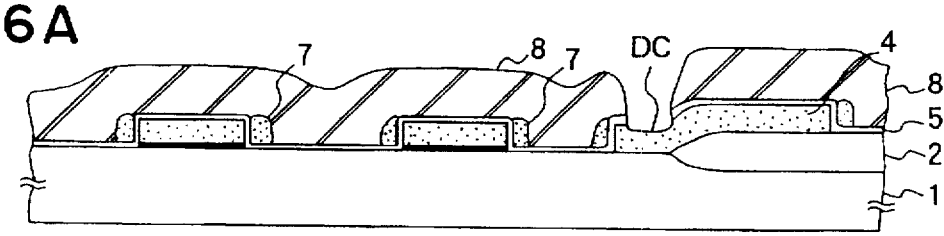

A resist 8 is applied on the substrate 1 to make contact between a polysilicon layer 9 to be deposited later and the polysilicon layer 4 that is a main part of the semiconductor device. The surface of the substrate 1 is patterned with the resist 8 as a mask to remove a part of the silicon oxide 5 to open a contact DC as shown in FIG. 6B.

Figure 6C:
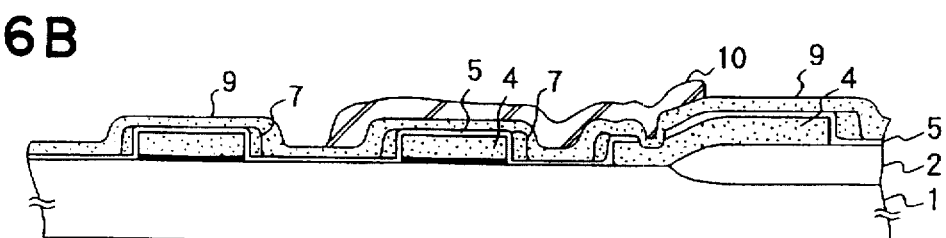

The resist 8 is removed and the polysilicon layer 9 is deposited. The polysilicon layers 4 and 9 are joined to each other through the contact DC. Further, the polysilicon layer 9 is joined to the conductive sidewall spacer 7. Then, a resist 10 is applied on the surface of the substrate 1. The resist 10 is exposed and developed to form an electrode pattern for the capacitance to be obtained as shown in FIG. 6C.

Figure 7A:
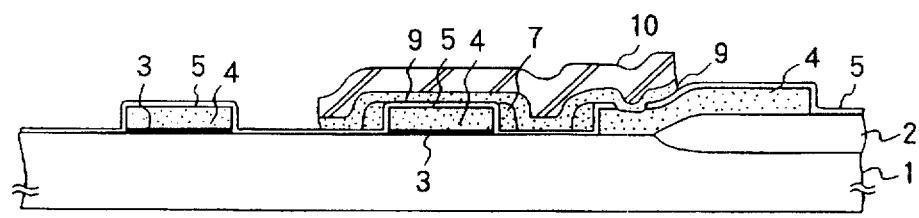

The polysilicon layer 9 is selectively etched through the electrode pattern by chemical dry etching. An necessarily sidewall spacer 7 is removed by this etching so that the polysilicon layer 9 covers the source, drain, and gate regions of the transistors to be obtained as shown in FIG. 7A.

Figure 7B:
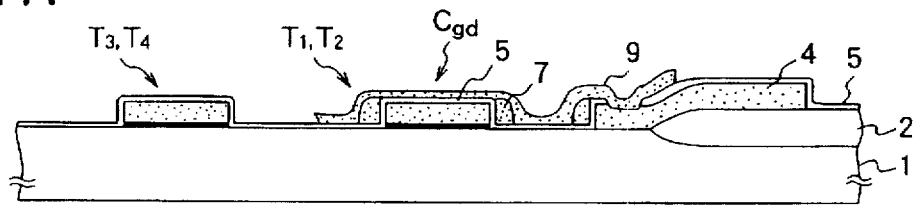

By removing the resist 10, appeared on the surface of the substrate 1 are transfer MOS transistors T3 and T4, drive MOS transistors of LDD structure T1 and T2, and a capacitor Cgd having two electrodes, one being a gate 4, and the other being the sidewall spacer 7 and polysilicon layer 9 as shown in FIG. 7B. The capacitor Cgd is formed in the vicinity of the gate 4 via thin oxide film 5 so that it has a relatively large capacitance.

After this, not shown, a polysilicon layer is deposited and patterned to form resistors R1 and R2 of high resistance. And, an aluminum film is deposited and patterned to form bit lines BL and /BL. Through these processes, a semiconductor device according to the present invention is produced.

As described above with respect to FIGS. 6B, 6C, and 7A: the resist 8 is applied on the substrate 1, and the surface of the substrate 1 is patterned with the resist 8 as a mask to remove a part of the silicon oxide 5 to open the contact DC; the resist 8 is removed and the polysilicon layer 9 is deposited; then, the resist 10 is applied on the surface of the substrate 1; the resist 10 is exposed and developed to form the electrode pattern; the resist 10 is exposed and developed to form the electrode pattern for the capacitance to be obtained; and, the polysilicon layer 9 is selectively etched through the electrode pattern by chemical dry etching to remove the unnecessarily sidewall spacer 7.

Figure 8A:
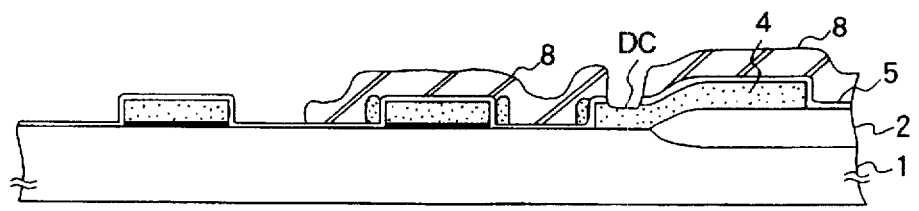
FIGS. 8A and 8B explain another method of producing a semiconductor device according to the present invention, in stead of the processes shown by FIGS. 6B and 6C.
Figure 8B:
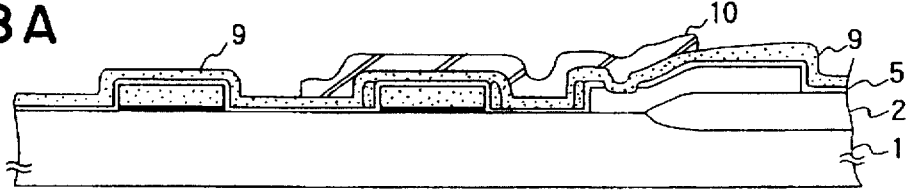

In stead of these processes, the unnecessarily sidewall spacer 7 can be removed first. As shown in FIG. 8A, the resist 8 is applied on the surface of the substrate 1, the unnecessarily sidewall spacer 7 is removed, and the oxide film 5 is opened. And, as shown in FIG. 8B, the resist 8 is peeled off, the polysilicon layer 9 is deposited, and the resist 10 as a mask is applied on the surface of the substrate 1 to etch the polysilicon layer 9.

The above embodiments are to increase capacitance of the memory cells of a SRAM. Not only this, the present invention can also be applied to increase gate capacitance of a transistor to adjust signal delay. The polysilicon layer 9 can be patterned in any pattern and supplied with an adequate potential to have desired capacitance.

As described above, according to the present invention, a conductive spacer is formed on the sidewall of a MOS transistor of a LDD structure. The sidewall spacer is connected to a capacitor film that covers the source, drain, and gate regions of the MOS transistor. The sidewall spacer and capacitor film are supplied with an potential different from the gate potential. The upper surface and sidewall of the gate are entirely covered with a conductive film in a close distance to increase the gate capacitance of the transistor. This results in a relatively large gate capacitance of the MOS transistor.

Further, since the capacitance is obtained three-dimensionally, the gate capacitance can be increased without increasing the pattern area.

What is claimed is:

1. A semiconductor device comprising:

at least one transistor formed on a semiconductor substrate, the transistor having a gate and a conductive sidewall spacer adjacent the gate;

a first conductive film formed on the semiconductor substrate:

an insulative film formed on the first conductive film; and a second conductive film formed on the insulative film, the second conductive film covering the gate of the transistor and connecting the conductive sidewall spacer and the first conductive film;

wherein the conductive sidewall spacer and the second conductive film define a capacitor electrode when a voltage different from a voltage supplied to the gate of the transistor is supplied to the capacitor electrode.

2. The semiconductor device according to claim 1, wherein the transistor is of a lightly-doped drain structure.

3. The semiconductor device according to claim 1, wherein the sidewall spacer is made of polysilicon.

4. The semiconductor device according to claim 1, wherein the second conductive film also covers at least one of a drain and a source of the transistor.

5. A semiconductor device according to claim 1, wherein the second insulative film is formed on the gate and the second conductive film is formed on the insulative film above the gate of the transistor.

6. A static random access memory cell circuit device comprising:
- at least one flip-flop having at least two transistors, each of the transistors formed on a semiconductor substrate and having a gate and a conductive sidewall spacer adjacent the gate;
- a first conductive film formed on the semiconductor substrate;
- an insulative film formed on the first conductive film; and
- a second conductive film formed on the insulative film, the second conductive film covering the gate of each of the transistors and connecting the conductive sidewall spacer and the first conductive film;
- wherein the conductive sidewall spacer and the second conductive film define a capacitor electrode when a voltage different from a voltage supplied to the gate of each of the transistors is supplied to the capacitor electrode.

7. A static random access memory cell circuit device according to claim 6, wherein the first conductive film is connected to a drain of each of the transistors.

* * * * *